United States Patent [19]
Blair et al.

[11] Patent Number: 5,428,624
[45] Date of Patent: Jun. 27, 1995

[54] FAULT INJECTION USING BOUNDARY SCAN

[75] Inventors: Larry D. Blair; John C. Joy, both of Longmont; William H. Dittenhofer, Boulder, all of Colo.

[73] Assignee: Storage Technology Corporation, Louisville, Colo.

[21] Appl. No.: 134,918

[22] Filed: Oct. 12, 1993

[51] Int. Cl.$^6$ ............................................. G01R 31/28
[52] U.S. Cl. ....................... 371/22.3; 371/16.5; 371/3; 371/29.1; 371/27; 364/578; 364/579; 364/580; 324/158.1
[58] Field of Search ........................ 364/578, 579, 580; 371/22.1, 22.3, 25.1, 27, 3, 23, 25.1, 16.1, 16.5; 324/158 R

[56] References Cited

U.S. PATENT DOCUMENTS

| | | | |
|---|---|---|---|
| 4,669,081 | 5/1987 | Mathewes, Jr. et al. | 371/3 |
| 4,875,209 | 10/1989 | Mathewes, Jr. et al. | 371/25.1 |
| 4,996,688 | 2/1991 | Byers et al. | 371/16.5 |
| 5,018,144 | 5/1991 | Corr et al. | 371/22.3 |
| 5,046,068 | 9/1991 | Kubo et al. | 371/16.1 |
| 5,115,435 | 5/1992 | Langford, II et al. | 371/22.1 |
| 5,130,988 | 7/1992 | Wilcox et al. | 371/23 |
| 5,130,989 | 7/1992 | Anderson et al. | 371/22.3 |
| 5,189,365 | 2/1993 | Ikeda et al. | 364/578 |
| 5,270,642 | 12/1993 | Parker | 324/158 R |
| 5,285,453 | 2/1994 | Gruodis | 371/27 |

OTHER PUBLICATIONS

Hewlett-Packard Company, HP Boundary-Scan Tutorial and BSDL Reference Guide, HP 307x Board Test System, Dec. 1990, Ch. 1–3, Appendix.

Mauder, Colin M. and Tulloss, Rod E., Testability on Tap, IEEE Spectrum, Feb., 1992, pp. 34–37.

*Primary Examiner*—Emanual T. Voeltz
*Assistant Examiner*—Alan Tran
*Attorney, Agent, or Firm*—William J. Kubida; Holland & Hart

[57] ABSTRACT

A system and method for fault injection utilizing boundary scan includes the provision of an additional fault injection register to the standard JTAG architecture in order to allow the intentional introduction of faults into a device or module forming part of a system under test. Through the use of the fault injection register of the present invention, faults may be intentionally introduced and the system response to such faults monitored and analyzed independently of the system software and without the use of mechanical probes or the like for introducing the fault. The system and method of the present invention is readily integrated with the existing test functions of the standard IEEE 1149.1 boundary scan architecture.

6 Claims, 5 Drawing Sheets

Fig_1
PRIOR ART

Fig-2 PRIOR ART

Fig_3
PRIOR ART

Fig_4

Fig-5

Fig_6

Fig_7

FAULT INJECTION USING BOUNDARY SCAN

BACKGROUND OF THE INVENTION

The present invention relates, in general, to the field of electronic product testing. More particularly, the present invention relates to techniques useful in the validation of electronic hardware diagnostics and redundant hardware utilizing boundary scan cells as defined by the Institute of Electrical and Electronics Engineers ("IEEE") Standard Test Access Port and Boundary Scan Architecture, IEEE Standard 1149.1-1990 promulgated in response to the industry Joint Test Action Group ("JTAG").

With the trend towards ever more densely populated integrated circuit boards and more highly integrated components, the problems attendant test, validation of design and verification of functionality become more complex. To ensure that a particular product performs to specification, it is generally necessary to inject faults or errors into the system to simulate a potential field problem and determine if system diagnostics detect the problem and respond properly by, for example, switching-in redundant hardware to take over the functionality of the failed board or component.

Currently, testing procedures have involved the connection of logic analyzers, emulators and other test or fault injecting equipment by means of hardware probes through jumper wires, robotic arms or test fixtures such as "bed-of-nails" testers. At the component level, as circuit functionality becomes increasingly integrated in silicon, the capability of isolating and physically accessing particular elements of a given component becomes extremely difficult if not impossible. Moreover, with the advent of surface mount technologies, test and validation procedures at the board level become even more problematic since test nodes must be accessed at the component side and components may be mounted on both sides of the board. Even the use of extender cards to provide physical access to test nodes may prove unsatisfactory due to the possibility that such an extender may cause problems with critical timing requirements.

As a result, the use of physical probing to detect system faults has been recognized by the industry as impractical, leading to the formation of JTAG, and culminating in the IEEE-1149.1 standard. The building of devices (whether components or board level systems) to the JTAG specification requires that they have the ability to test themselves through built-in self test ("BIST") by allowing access to nodes and circuits which are otherwise physically inaccessible. This capability is based upon a test access port ("TAP") state machine which allows control and access to a "boundary scan" architecture. To implement the boundary scan architecture the component or board must include boundary scan cells which are implemented between each component pin or board connector and the internal logic circuitry. The boundary scan cells are also connected together forming a shift register path around the periphery of the circuit giving rise to the term boundary scan.

Boundary scan, which is increasingly integrated with more and more components and board level systems, therefore allows the internal logic of a component or board level system to be tested without being physically probed. Significantly, however, the JTAG boundary scan architecture has heretofore been utilized solely to detect existing faults and neither contemplates nor provides a means to intentionally inject them into the product to determine the validation of on-board diagnostics and/or redundant hardware.

SUMMARY OF THE INVENTION

The present invention, discloses the utilization of the JTAG boundary scan architecture to purposefully inject selected faults into the product under test through the provision of an additional fault injection register thereby obviating the necessity of physically probing the particular component or circuit board subject to validation testing. The technique of injecting faults using the dedicated test bus of the JTAG boundary scan architecture through a fault injection register also means that the error injection path will be independent of the normal data path. This allows the software utilized to inject the faults to be completely independent of the system software and precludes the unintended introduction of faults by the latter during design.

In accordance with a particular embodiment of the present invention, an integrated circuit device is disclosed which includes a boundary scan test circuit integrated therewith. The boundary scan test circuit includes a test access port state machine receiving test mode select and test clock input signals and is operative in association with instruction, boundary scan and bypass registers for selectively coupling a test data input signal to a test data output signal. The improvement in combination with the foregoing comprises a fault injection register selectable by the instruction register for coupling the test data input signal to the test data output signal, the fault injection register being responsive to the test access port state machine and the instruction register for providing a fault injection control signal to the integrated circuit device.

Further disclosed is an electronic module including n integrated circuit devices, each including a boundary scan test circuit integrated therewith. Each boundary scan test circuit includes a test access port state machine receiving test mode select and test clock input signals and is operative in association with instruction, boundary scan and bypass registers for selectively coupling a test data input signal to a test data output signal wherein the test data output signal of each of the n-1 integrated circuit devices is supplied as the test data input signal of a next one of the n integrated circuit devices. The improvement in combination with the foregoing comprises a fault injection register associated with each of the boundary scan test circuits selectable by the instruction register for coupling the test data input signal to the test data output signal. The fault injection register is responsive to the test access port state machine and the instruction register for providing a fault injection control signal to the electronic module.

BRIEF DESCRIPTION OF THE DRAWINGS

The aforementioned and other features and objects of the present invention and the manner of attaining them will become more apparent and the invention itself will be best understood by reference to the following description of a preferred embodiment of the present invention, taken in conjunction with the accompanying drawings, wherein.

DESCRIPTION OF A PREFERRED EMBODIMENT

Figure 1:
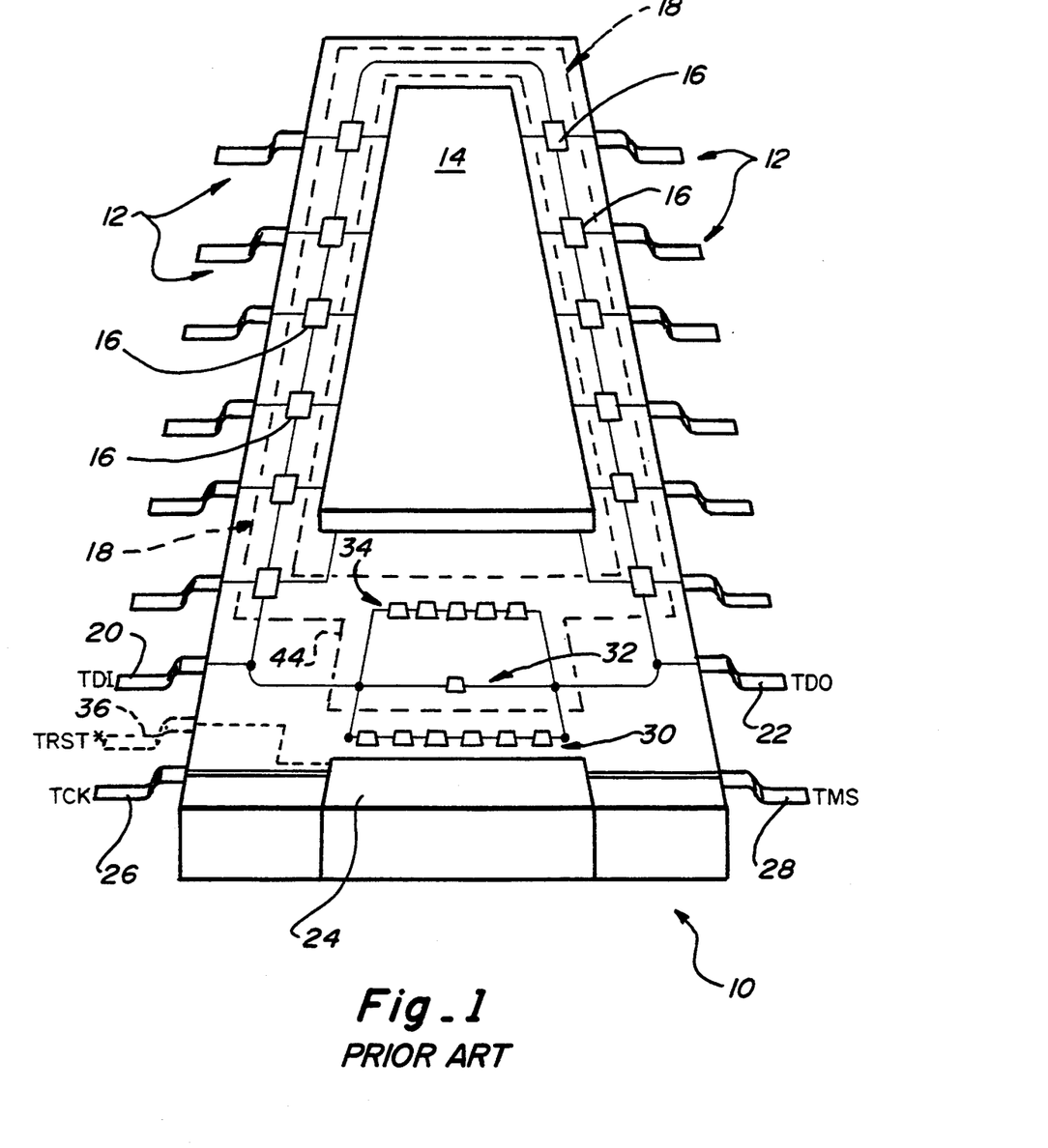
FIG. 1 is a simplified, perspective view of a prior art integrated circuit device incorporating standard boundary scan elements in accordance with the IEEE standard 1149.1.

With reference to FIG. 1, a prior art integrated circuit 10 incorporating standard boundary scan elements in accordance with IEEE standard 1149.1 is shown. In this regard, the disclosure of the Institute of Electrical and Electronics Engineers Standard Test Access Port and Boundary Scan Architecture, IEEE standard 1149.1-1990 is hereby specifically incorporated by reference with respect to the standard JTAG boundary scan architecture illustrated. The IEEE Standard 1149.1 architecture is also described in the: "Hewlett-Packard Boundary-Scan tutorial and BSDL Reference Guide" published December, 1990, as well as in "The ABCs of Boundary-Scan Test" published in 1991 by the John Fluke Manufacturing Company from which the illustrations and description of prior art boundary scan devices and modules is derived.

Integrated circuit ("IC") 10 incorporates a number of input/output ("I/O") pins 12 for interconnecting the internal logic 14 thereof to other electronic devices and circuitry. The IC 10 I/O pins 12 each have an associated boundary scan cell ("BSC") 16 which, in combination, comprise a boundary scan register 18.

IC 10 also incorporates a test data input ("TDI") 20 coupled to the boundary scan register 18 as well as providing an input to the instruction register ("IR") 30. TDI input 20 also supplies input to the bypass register 32 and optional registers 34 together with the boundary scan register 18 illustrated as comprising test data registers ("TDRs") 44. Output appearing on test data output ("TDO") 22 is taken from the output of the TDRs 44 comprising boundary scan register 18, bypass register 32 and optional registers 34.

A test access port ("TAP") controller 24, which is functionally a state machine, receives inputs designated test clock ("TCK") 26 and test mode select ("TMS") 28. In accordance with the boundary scan architecture, an optional test reset ("TRST") input 36 may also be provided to TAP controller 24.

The BSCs 16 for the I/O pins 12 of IC 10 are interconnected to form a shift-register chain, referred to as a boundary scan register 18. The boundary scan register 18 provides a serial path surrounding the internal logic 14 and is provided with a TDI input 20 and a TDO output 22 connection in addition to appropriate clock and control signals. In this manner, test data may be shifted through the boundary scan path from the TDI input 20 to the TDO output 22 to effectuate test node accessibility.

The instruction register 30 is used to select the test to be performed and/or the test data register 44 to be accessed. The bypass register 32 provides a 1 bit path to effectively minimize the distance between TDI input 20 and TDO output 22. The IEEE 1149.1 standard also provides for optional design on device specific test registers as will be more fully described hereinafter. The functional operation of the boundary scan circuitry of IC 10 is controlled by the TAP controller 24.

Figure 2:
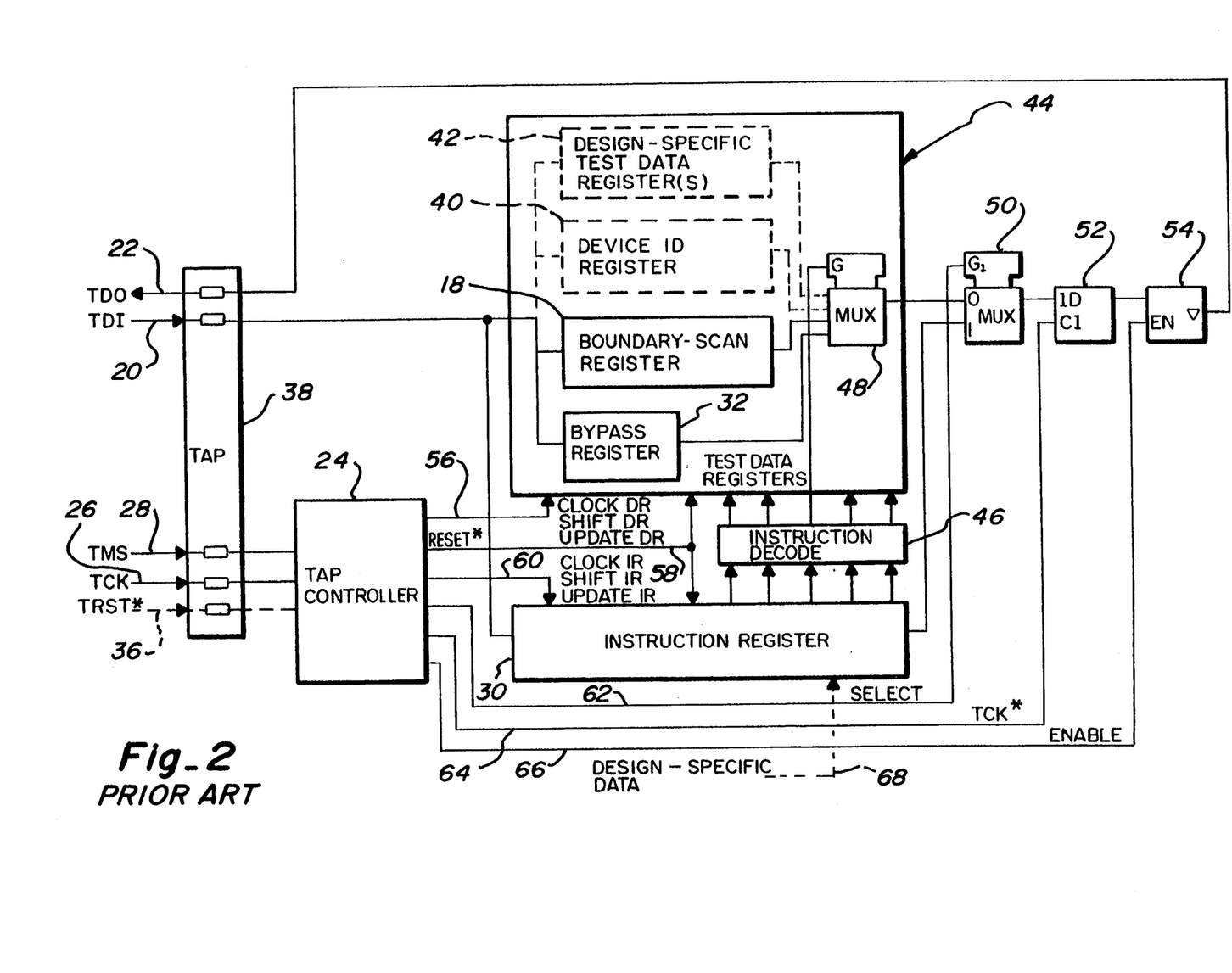
FIG. 2a is a representative, logic block diagram of a prior art boundary scan device illustrating the test access port, test access port controller, instruction register and test data registers thereof.

With reference now to FIG. 2, a representative logic block diagram of a typical boundary scan device is shown in more detail. The overall test architecture for a boundary scan device incorporates, in pertinent part, a test access port ("TAP") 38, a TAP controller 24, an IR register 30 and a number of test data registers 44 incorporating a boundary scan register 18, a bypass register 32 and one or two additional test registers as shown. In the conventional boundary scan architecture, the latter optional registers may include a device identification ("ID") register 40 as well as a design-specific test data register 42.

The TDI input 20 is supplied through the test access port 38 for input to the test data registers 44 and instruction register 30 as shown. Output of the bypass register 32, boundary scan register 18 and any optional test registers are supplied as input to multiplexer ("MUX") 48 for output to MUX 50 as shown. A gating input to MUX 48 is received from the instruction decode logic 46 as controlled by instruction register 30.

TMS input 28, TCK input 26 and an optional TRST input 36 are also supplied to the test access port 38 for input to TAP controller 24. Outputs of the TAP controller 24 are supplied on data register ("DR") line 56 providing signals such as a clock DR, a shift DR and an update DR. When utilized in conjunction with an optional TRST input 36, the TAP controller 24 may additionally supply a reset signal on reset line 58 to test data registers 44 and instruction register 30. Similarly, TAP controller 24 supplies a clock IR, a shift IR and an update IR signal on instruction register line 60 for input to instruction register 30. Outputs from instruction register 30 are decoded through instruction decode logic 46 for input to the test data registers 44. Instruction register 30 also supplies an input to MUX 50 receiving as an additional input the output of MUX 48 from the test data registers 44. A gating input to MUX 50 is received from the output of the TAP controller 24 on select line 62.

Output of MUX 50 is furnished to the data input of shift register 52 having a clocking signal from the TAP controller 24 on TCK line 64. Output from shift register 52 is provided as input to latch 54 having an enable input also coupled to the output of the TAP controller 24 on enable line 66. Output of latch 54 is supplied to the test access port 38 as TDO output 22. As shown, an additional input to instruction register 30 may include design-specific data as determined by the user for input on design specific data line 68.

The overall boundary scan test architecture requires that the test access port 38 include 4 or 5 device pins which are dedicated to control, input and output functions. Each device also contains a TAP controller 24, and instruction register 30, a boundary scan register 18 and a bypass register 32.

The test access port 38 is a general purpose port which directs control signals into the boundary scan device as well as providing the serial input and output pins for the boundary scan logic. The TAP controller 24 is a 16 state, state machine which is programmable by the TMS input 28 and TCK input 26 to control the flow of data bits to the instruction register 30 as well as the test data registers 44. The TAP controller 24 is therefore, the functional control center of the boundary scan device.

The instruction register 30 decodes the instruction to be performed by the test data registers 44 as well as selecting the particular one or test data registers 44 to be accessed. The test data registers 44 include the boundary scan register 18 and the bypass register 32 as previously described.

The TCK input 26 provides the clock for the test logic and is a dedicated input which allows the serial test data path to be utilized independently of any component specific system clocks. The TCK input 26 also permits shifting of test data concurrently with normal component operation.

The TMS input 28 along with a rising edge applied to the TCK input 26 causes the movement from one state to another through the TAP controller 24. In turn, this allows the shifting of data and TAP instructions through the state machine.

The TDI input 20 provides serial inputs for test instructions shifted into the instruction register 30 and for data shifted through the boundary scan register 18 or others of the test data registers 44. The values are clocked into the selected register on the rising edge of the signal on TCK input 26. The TDO output 22 is the serial output for test instructions and data from the boundary-scan register 18 or other of the test data registers 44. The contents of the selected register, whether instruction register 30 or one of the test data registers 44, are shifted out on the falling edge of the signal on TCK input 26.

The optional TRST input 36 provides asynchronous initialization of the TAP controller 24 which in turn causes asynchronous initialization of other test logic included in the design. A reset signal on TRST input 36 would place the device in the normal operating mode and render the boundary-scan register 18 inactive.

Figure 3:
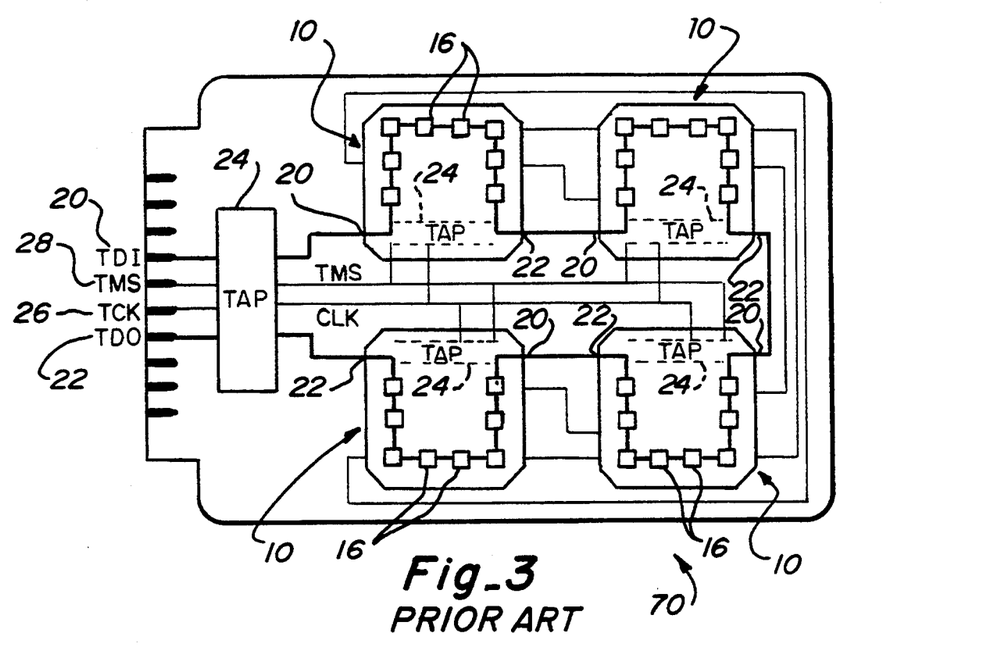
FIG. 3 is a simplified, representative view of a prior art printed circuit board, or module, incorporating a number of integrated circuits including boundary scan cells connected in a "daisy chain" configuration to form a single serial path at the printed circuit board level.

With reference now to FIG. 3, a simplified representative view of a prior art printed circuit board ("PCB") 70 is shown incorporating a number of integrated circuits 10 including boundary scan cells 16 connected in a "daisy chain" configuration to form a single serial path at the printed circuit board level. By interconnecting the TAP 38 input and output connections of the various integrated circuits 10, the PCB 70 can be appropriately tested. The printed circuit board, or module 70, has all the integrated circuit 10 test access ports 38 to the TAP controllers 24 connected in series for the TDI input 20 and TDO output 22 path. The TMS input 28 and TCK input 26 to each integrated circuit 10 are connected in parallel while all the test data pins are connected in a "daisy chain" to form a single serial path.

At the printed circuit board 70 level it is possible to perform test measurements in accordance with the boundary scan architecture. First, the circuitry around the integrated circuit 10 can be tested by connecting the leads for opens or shorts or by applying test signals to the output pins of one integrated circuit 10 and analyzing the results through the input pins of the remaining integrated circuits 10. In addition, internal integrated circuit 10 tests can be initiated such as a built in self test. In this manner, the test results may be sampled into the registers of the output boundary-scan cells 16 and the results shifted through the boundary scan cells toward the test access port 38 TDO output pin 22.

Figure 4:
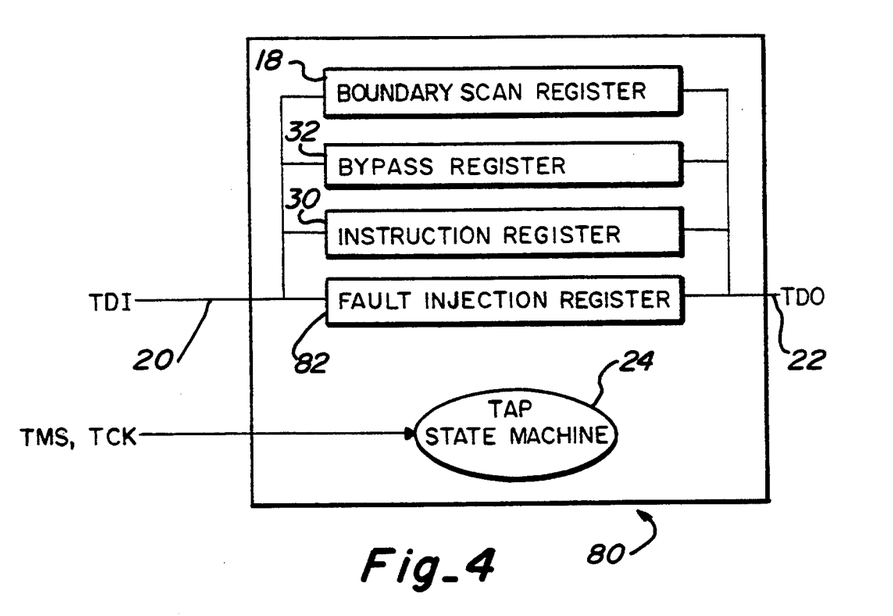
FIG. 4 is a simplified logic block diagram of an integrated circuit device, for example, an application specific integrated circuit ("ASIC") in accordance with the present invention incorporating a fault injection register in addition to other IEEE standard 1149.1 boundary scan elements.

With reference now to FIG. 4, a simplified logic block diagram of an integrated circuit 80, such as an application specific integrated circuit ("ASIC") is shown incorporating a fault injection register 82 in accordance with the present invention. The fault injection register 82 of integrated circuit 80 is in addition to the conventional instruction register 30, as well as the boundary-scan register 18 and bypass register 32 of a conventional boundary scan architecture. By designing in a fault injection register 82 into integrated circuit 80, it is possible to inject a fault signal into the device to check its response and the response of any system software to the fault condition. Conventional integrated circuits utilizing boundary scan architecture do not include a fault injection register 82 or any analogous component. Rather, the test data registers of the conventional boundary scan device are utilized for testing the device or printed circuit board and not for purposefully injecting fault conditions into the device to check the response of the system thereto.

Figure 5:
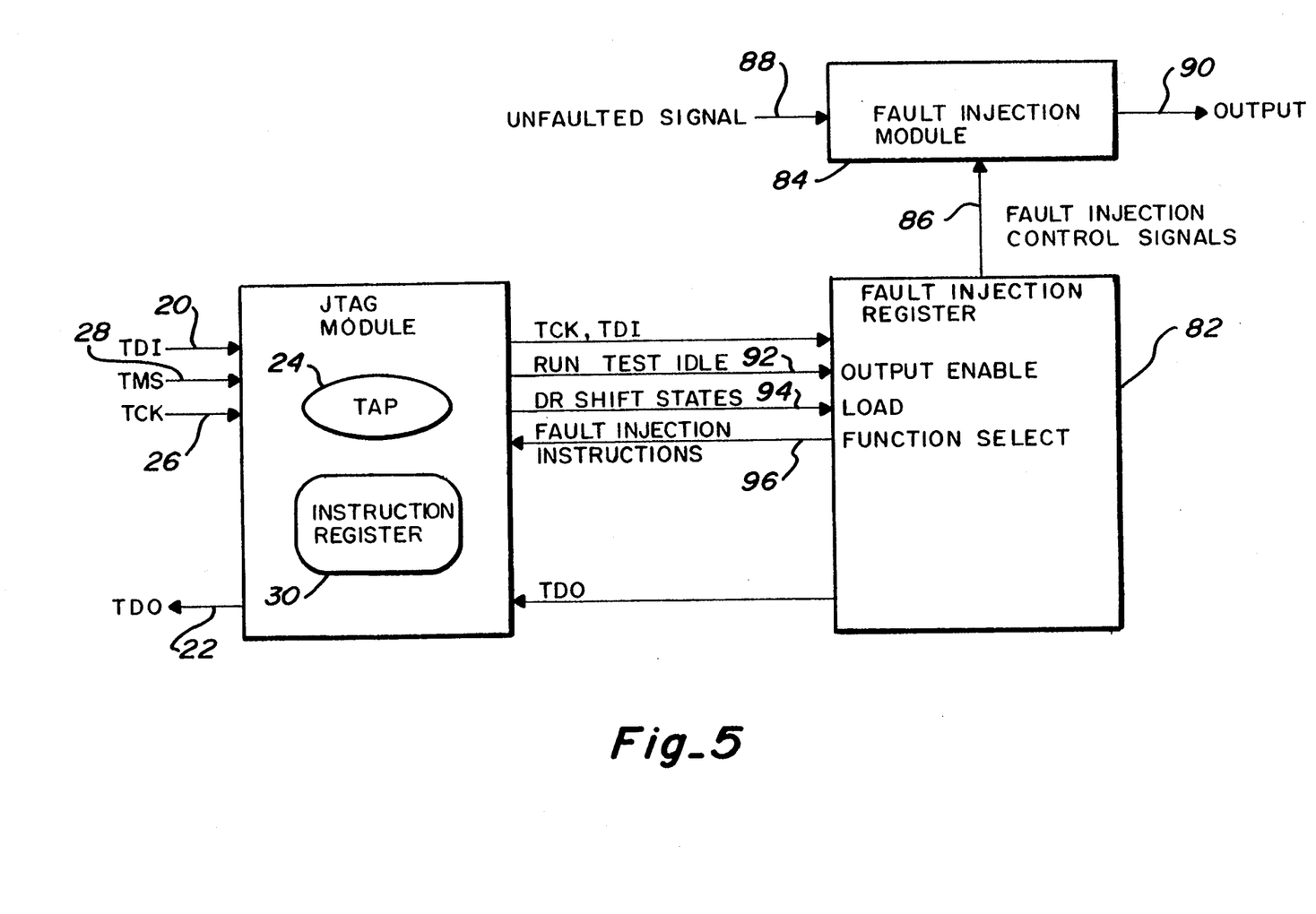
FIG. 5 is a simplified logic block diagram of a JTAG module and fault injection register of the present invention as shown in FIG. 4 for use in conjunction with a fault injection module for injecting faults into a system to simulate potential faults or errors that might occur in order to determine if the system diagnostics will recognize the same and effectuate an appropriate response.

With reference additionally now to FIG. 5, a system for utilizing a device such as an integrated circuit including a fault injection register 82 is shown. In the description of FIG. 5, conventional aspects of the boundary scan architecture as previously described are like numbered and the foregoing description thereof shall suffice herefor. In the embodiment shown, fault injection register 82 is utilized to insert fault injection control signals 86 to a fault injection module 84. Fault injection module 84 couples the system software unfaulted signal 88 to an output 90 thereby allowing fault signals to be inserted into the system such that the system's response thereto can be gauged. Through the use of the fault injection register 82 in conjunction with the fault injection module 84, the software utilized to develop the fault signals to test the system remain in isolation from the actual system software to aid in the determination of proper system operation in response to the fault. As shown, inputs from the JTAG module are supplied to the fault injection register on run, test, idle signal line 92 and data register ("DR") shift states line 94. Fault injection register 96 returns a signal on fault injection instruction signal line 96 to the JTAG module as shown. As has been previously described, the conventional utilization for the boundary scan architecture is to test a device or system by detecting inherent faults. There is, however, nothing in the boundary scan specification which suggests that the same architecture may be utilized in conjunction with a fault injection register 82 to inject faults into the device or product. Therefore, by utilizing the fault injection register 82 of the present invention, any device or circuit node, part, bus or module could have a test vector scanned into it in order to place a fault into the system while the remainder of the system functions as normal. In this manner, the system could then be observed and it could be determined if it responded according to design specifications to such fault.

Because the boundary scan architecture utilizes a dedicated test bus, the error injection path is independent of the normal system data path. This is advantageous because the software used to inject the fault is then totally independent of the system software. Moreover, the system designer would not have to be concerned that faults will accidentally be injected by the system software. Utilizing the fault injection register 82 of the present invention in conjunction with conventional boundary scan architecture does not require any external hardware or extender cards to probe the node to inject the faults.

Figure 6:
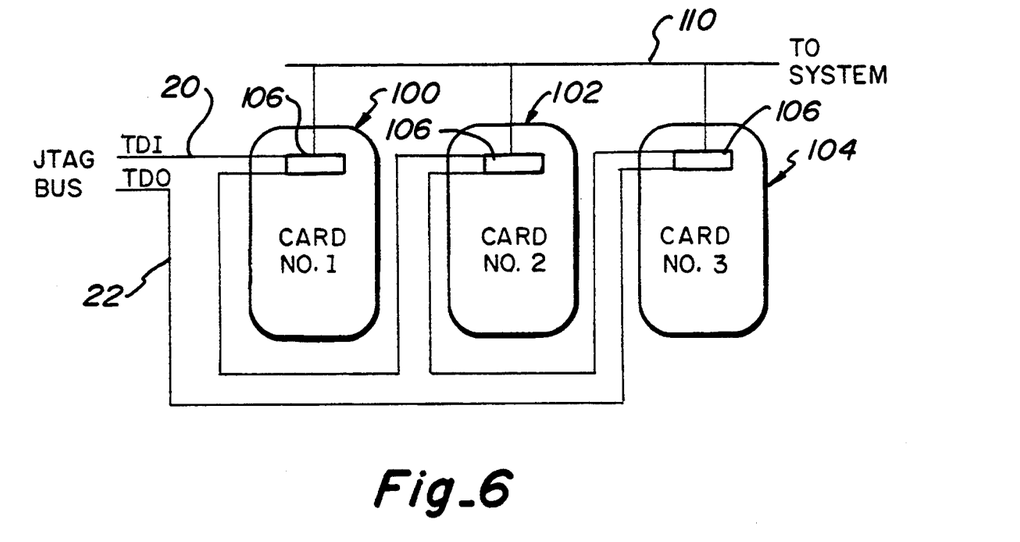
FIG. 6 is an exemplary, simplified logic block diagram of a redundant system incorporating the fault injection system of the present invention whereby when a system card, or module, encounters an injected fault in the system interface, the system software will recognize the fault and assign the faulted system card's function to one of the other cards.

With reference now to FIG. 6, an exemplary utilization of a fault injection register in conjunction with a number of system interfaces 106 incorporating JTAG included within a number of system cards 100, 102 and 104 is shown. System interfaces 106 are coupled to the system under test through system bus 110 and have their TDI inputs 20 and TDO outputs 22 connected in series in a daisy chain fashion.

In the example of FIG. 6, system cards 100, 102 and 104 form part of a redundant system wherein each of the system cards 100, 102 and 104 may perform identical functions. When a particular system card encounters a fault injected through a fault injection register 82 forming part of its system interface 106, the system software would be observed to see whether it isolates the failed system card and thereafter assigns that card's function to one of the other system cards. The fault vector may be scanned in via the system interface 106 JTAG buffer incorporating a fault injection register 82 to see whether the system detects the fault and responds appropriately.

Figure 7:
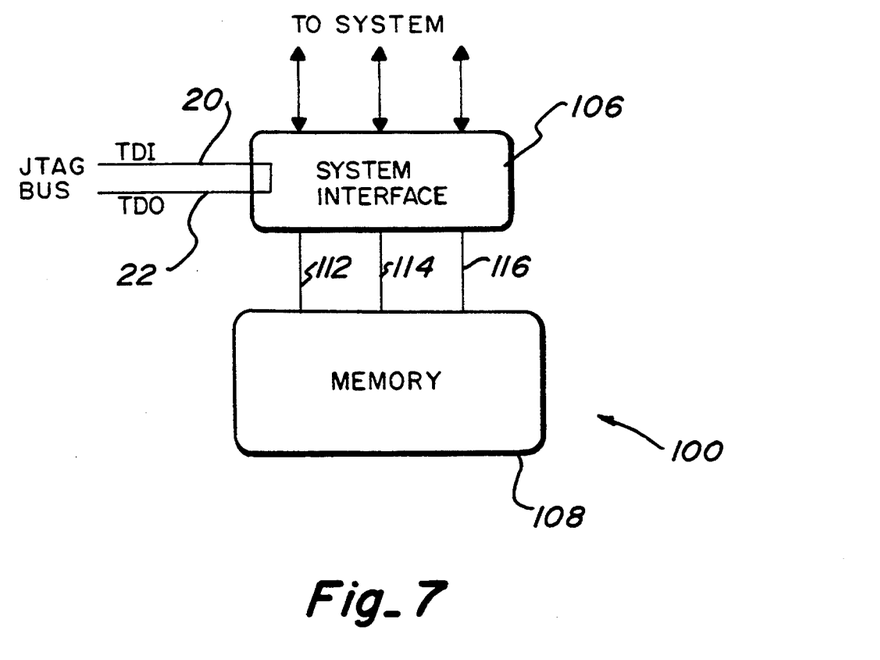
FIG. 7 is a simplified, detailed logic block diagram of a system card as shown in FIG. 6, for example, a memory card.

With reference additionally now to FIG. 7, a memory module 108 forming part of a system card 100 is shown wherein the memory module 108 includes a data bus 112, an EDAC bus 114 and an address bus 116 coupled to a system interface 106 incorporating a fault injection register 82. The system interface 106 includes, in conventional manner, a TDI input 20 and a TDO output 22. The system card 100 incorporating the memory module 108 is coupled to the system under test through the system interface 106.

In this example, faults may be injected via the TDI input 20 of the JTAG bus into the system interface 106. The system interface 106 will latch the faults on the data 112, EDAC bus 114 or address bus 116. In this manner, the system diagnostics can detect the faults and respond appropriately, such as by switching in a redundant memory module.

As has been described, the incorporation of a fault injection register in conjunction with the standard boundary scan architecture, allows the intentional introduction of faults into a device or module to test the response of system software to the fault so induced. The normal function of the boundary scan architecture is merely to detect faults that have occurred within a device or module by outside means. By incorporating a fault injection register into the design, the fault can be entered into the device or module unobtrusively during the normal functioning of the system under test. By introducing the fault at a desired point in time and location, the system software can be analyzed to determine that it responds appropriately. The appropriate response may be, in the context of a redundant system, the isolation of a failed module and the substitution of a redundant module to replace the functionality of the failed module. Through the use of a fault injection register 82 in accordance with the present invention, the system diagnostics will be able to detect the injected faults and the system software then analyzed to determine that it causes the system to respond appropriately.

What has been provided therefore is a boundary scan test circuit which includes a test access port state machine for receiving a test mode select and test clock input signals and is operative in association with instruction, boundary scan and bypass registers for selectively coupling a test data input signal to a test data output signal. The improvement of the present invention comprises, in combination, a fault injection register which is selectable by the instruction register for coupling a test data input signal to the test data output signal wherein the fault injection register is responsive to the test access port state machine and the instruction register for providing a fault injection control signal to an integrated circuit device or printed circuit board module.

In accordance with a method of the present invention, a method for injecting selected faults to an integrated circuit device or electronic module is disclosed wherein the integrated circuit device or module includes a boundary scan test circuit integrated therewith. The boundary scan test circuit includes a test access port state machine receiving test mode select and test clock input signals and the test access port state machine is in operative association with instruction, boundary scan and bypass registers for selectively coupling a test data input signal to a test data output signal. The improved method of the present invention in combination with the foregoing includes the provision of a fault injection register selectable by the instruction register for coupling the test data input signal to the test data output signal. A fault injection control signal is output to the integrated circuit device or module in response to control signals from the test access port state machine and the instruction register.

What is claimed is:

1. A diagnostics system for validating diagnostic circuitry of an electrical circuit having at least a first system card and a second system card wherein the first and second system cards, respectively, each are operative to perform identical functions, said diagnostics system comprising:
   a first system interface disposed together with the first system card, said first system interface having a first boundary scan circuit incorporating first test access port state machine in operative association with a first instruction register, a first boundary scan register, a first bypass register, and a first fault injection register, the first fault injection register for selectably injecting a fault vector to first circuitry of the first system card;
   a second system interface disposed together with the second system card, said second system interface having a second boundary scan circuit incorporating a second test access port state machine in operative association with a second instruction register, a second boundary scan register, a second bypass register, and a second fault injection register, the second fault injection register for selectably injecting the fault vector to second circuitry of the second system card; and system software operative responsive to the fault vector, when injected to the first circuitry of the first system card, to isolate the first system card and to assign functioning of the first system card to the second system card and operative responsive to the fault vector when injected to the second circuitry of the second system card, to isolate the second system card and the assign functioning of the second system card to the first system card.

2. The diagnostics system of claim 1 wherein said first test access port state machine receives test mode select and test clock input signals.

3. The diagnostics system of claim 1 wherein said second test access port state machine receives test mode select and test clock input signals.

4. A method for validating diagnostic circuits of an electrical circuit having at least a first system card and a second system card wherein the first and second system cards, respectively, each are operative to perform identical functions, said method comprising the steps of:

selectably injecting a fault vector through a first fault injection register which forms a portion of a first boundary scan circuit disposed together with the first system card to first circuitry of the first system card;

selectably injecting the fault vector through a second fault injection register which forms a portion of a second boundary scan circuit disposed together with the second system card to second circuitry of the second system card;

isolating the first system card and assigning functioning of the first system card to the second system card responsive to injection of the fault vector to the first circuitry; and isolating the second system card and assigning functioning of the second system card to the first system card responsive to injection of the fault vector to the second circuitry.

5. The diagnostics system of claim 2 wherein said first test access port state machine receives the test mode select and test clock input signals and selectively couples a test data input signal to a test data output signal and wherein said first fault injection register is selectable by said first instruction register for coupling said test data input signal to said test data output signal, said first fault injection register being responsive to said first test access port state machine and said first instruction register for generating a fault injunction control signal.

6. The diagnostics system of claim 3 wherein said second test access port state machine receives the test mode select and test clock input signals and selectively couples a test data input signal to a test data output signal and wherein said second fault injection register is selectable by said second instruction register for coupling said test data input signal to said test data output signal, said second fault injection register being responsive to said second test access port state machine and said second instruction register for generating a fault injection control signal.

* * * * *